(12) United States Patent
Liu et al.

(10) Patent No.: US 11,075,280 B2
(45) Date of Patent: Jul. 27, 2021

(54) SELF-ALIGNED GATE AND JUNCTION FOR VTFET

(71) Applicant: International Business Machines Corporation, Armonk, NY (US)

(72) Inventors: Zuoguang Liu, Schenectady, NY (US); Kangguo Cheng, Schenectady, NY (US); Oleg Gluschenkov, Tannersville, NY (US); Muthumanickam Sankarapandian, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 16/387,314

(22) Filed: Apr. 17, 2019

(65) Prior Publication Data

US 2020/0335601 A1    Oct. 22, 2020

(51) Int. Cl.
| | |
|---|---|
| H01L 29/66 | (2006.01) |
| H01L 21/265 | (2006.01) |
| H01L 21/02 | (2006.01) |
| H01L 21/266 | (2006.01) |
| H01L 29/78 | (2006.01) |

(52) U.S. Cl.
CPC .. *H01L 29/66545* (2013.01); *H01L 21/02164* (2013.01); *H01L 21/02238* (2013.01);
(Continued)

(58) Field of Classification Search
CPC ............... H01L 29/66666; H01L 29/78642
See application file for complete search history.

(56) References Cited

U.S. PATENT DOCUMENTS

| 6,197,641 B1 | 3/2001 | Hergenrother et al. |
| 6,821,851 B2 | 11/2004 | Hergenrother et al. |
(Continued)

OTHER PUBLICATIONS

Leitz et al., "Hole mobility enhancements and alloy scattering-limited mobility in tensile strained Si/SiGe surface channel metal-oxide-semiconductor field-effect transistors," Journal of Applied Physics, vol. 92, No. 7, pp. 3745-3751 (Oct. 2002).
(Continued)

*Primary Examiner* — Moazzam Hossain
*Assistant Examiner* — Hajar Kolahdouzan
(74) *Attorney, Agent, or Firm* — Randall Bluestone; Michael J. Chang, LLC

(57) ABSTRACT

Self-aligned gate/junction for VTFET devices are provided. In one aspect, a method of forming a VTFET device includes: forming a stack on a wafer including a first c-SiGe layer, a c-Si layer, and a second c-SiGe layer, wherein the first c-SiGe layer serves as a bottom source/drain; forming fin hardmasks on the stack; partially recessing the second c-SiGe layer to form a fin(s) in the second c-SiGe layer, wherein the second c-SiGe layer that is partially recessed/fin(s) serve as a top source/drain; amorphizing the c-Si layer to form a-Si regions in between c-Si regions that serve as vertical channels; selectively removing the a-Si regions to form gate trenches; forming bottom/top spacers in the gate trenches; and forming gates in the gate trenches that are offset from the bottom/top source/drain by the bottom/top spacers. A VTFET device is also provided. The VTFET device is suitable for 3D monolithic integrated circuits.

16 Claims, 11 Drawing Sheets

(52) U.S. Cl.
CPC .. *H01L 21/02255* (2013.01); *H01L 21/02532* (2013.01); *H01L 21/02598* (2013.01); *H01L 21/02636* (2013.01); *H01L 21/266* (2013.01); *H01L 21/26513* (2013.01); *H01L 29/66553* (2013.01); *H01L 29/66666* (2013.01); *H01L 29/7827* (2013.01); *H01L 29/7848* (2013.01)

(56) References Cited

U.S. PATENT DOCUMENTS

| | | |
|---|---|---|
| 9,929,152 B2 | 3/2018 | Anderson et al. |
| 9,935,101 B2 | 4/2018 | Cheng et al. |
| 10,002,962 B2 | 6/2018 | Anderson et al. |
| 10,014,222 B2 | 7/2018 | Cheng |
| 2006/0091455 A1 | 5/2006 | Adan |
| 2019/0206743 A1* | 7/2019 | Zang ................... H01L 21/2018 |

OTHER PUBLICATIONS

Dr. Alan Doolittle, "Ion Implantation," Lecture 5, Georgia Tech, accessed online Jan. 25, 2019 (21 pages).

Liu et al., "Dual Beam Laser Annealing for Contact Resistance Reduction and Its Impact on VLSI Integrated Circuit Variability," 2017 Symposium on VLSI Technology (Jun. 2017) (2 pages).

Tanaka et al., "Abnormal oxidation characteristics of SiGe/Si-on-insulator structures depending on piled-up Ge fraction at SiO2/SiGe interface," Journal of Applied Physics vol. 103, issue 5, 054909 (Mar. 2008) (5 pages).

\* cited by examiner

SELF-ALIGNED GATE AND JUNCTION FOR VTFET

FIELD OF THE INVENTION

The present invention relates to vertical transport field-effect transistor (VTFET) devices, and more particularly, to techniques for self-aligned gate and junction for VTFET devices.

BACKGROUND OF THE INVENTION

As opposed to planar complementary metal-oxide-semiconductor (CMOS) devices, vertical transport field-effect transistors (VTFETs) are oriented with a vertical fin-shaped channel disposed on a bottom source/drain and a top source/drain disposed on the fin-shaped channel. VTFET devices are one of the promising device architectures for scaling CMOS beyond the 7 nanometer (nm) technology node. A VTFET vertical arrangement eases multilayer transistor stacking known as three-dimensional (3D) monolithic integrated circuits.

One notable challenge associated with a VTFET architecture is gate length control, which is also related to gate/junction position. Gate length variation and variation of junction position undesirably leads to inconsistent device characteristics and performance. Furthermore, incorporation of VTFETs into 3D monolithic integrated circuits requires maintaining a low thermal budget in constructing the upper layers of the VTFETs such that underlying layers are not substantially degraded.

Thus, techniques for VTFET fabrication that reduce variations in gate length and junction position and have a low thermal budget would be desirable.

SUMMARY OF THE INVENTION

The present invention provides techniques for self-aligned gate and junction for vertical transport field-effect transistor (VTFET) devices. In one aspect of the invention, a method of forming a VTFET device is provided. The method includes: forming a stack on a wafer, the stack including a first crystalline silicon germanium (c-SiGe) layer disposed on the wafer, a crystalline silicon (c-Si) layer disposed on the first c-SiGe layer, and a second c-SiGe layer disposed on the c-Si layer, wherein the first c-SiGe layer serves as a bottom source and drain of the VTFET device; forming fin hardmasks on the stack; partially recessing the second c-SiGe layer using the fin hardmasks to form at least one fin in the second c-SiGe layer, wherein the second c-SiGe layer that is partially recessed and the at least one fin serve as a top source and drain of the VTFET device; amorphizing the c-Si layer in between the fin hardmasks to form amorphous Si (a-Si) regions in between c-Si regions, wherein the c-Si regions serve as vertical channels of the VFET device; selectively removing the a-Si regions to form gate trenches self-aligned with the vertical channels; forming bottom spacers and top spacers in the gate trenches; and forming gates in the gate trenches alongside the vertical channels, wherein the gates are offset from the bottom source and drain and the top source and drain by the bottom spacers and the top spacers.

In another aspect of the invention, a VTFET device is provided. The VTFET device includes: a first c-SiGe layer disposed on a wafer, wherein the first c-SiGe layer serves as a bottom source and drain of the VTFET device; vertical channels of the VFET device disposed on the first c-SiGe layer, wherein the vertical channels include c-Si; a second c-SiGe layer disposed on the vertical channels having fins formed therein, wherein the second c-SiGe layer is partially recessed, and wherein the second c-SiGe layer that is partially recessed and the fins serve as a top source and drain of the VTFET device; gate trenches self-aligned with the vertical channels between the bottom source and drain and the top source and drain; bottom spacers and top spacers disposed in the gate trenches; and gates formed in the gate trenches alongside the vertical channels, wherein the gates are offset from the bottom source and drain and the top source and drain by the bottom spacers and the top spacers.

A more complete understanding of the present invention, as well as further features and advantages of the present invention, will be obtained by reference to the following detailed description and drawings.

DETAILED DESCRIPTION OF PREFERRED EMBODIMENTS

As provided above, vertical transport field-effect transistor (VTFET) devices are oriented with a vertical fin channel disposed on a bottom source/drain and a top source/drain disposed on the fin channel. A gate is present alongside the vertical fin channel, offset from the bottom and top source and drains by bottom and top spacers, respectively. With conventional VTFET designs, however, the bottom and top source/drain are formed at different points in the process which invariably leads to variations in the gate length and junction position. Advantageously, provided herein are VTFET devices, and techniques for fabrication thereof, having a self-aligned gate and junction. Thus, variations in the gate length and junction position are avoided.

As will be described in detail below, the present techniques leverage the solid phase epitaxy (SPE) temperature differences for crystallization of materials such as silicon (Si) and silicon germanium (SiGe) to selectively form crystalline SiGe (c-SiGe) over amorphous Si (a-Si) at the top junction which enables etch selective removal (of a-Si over c-Si/c-SiGe) to open a self-aligned gate region along the vertical channel. Further, preferential (low-temperature) oxidation of SiGe over Si is employed to form the bottom and top spacers.

Figure 1:
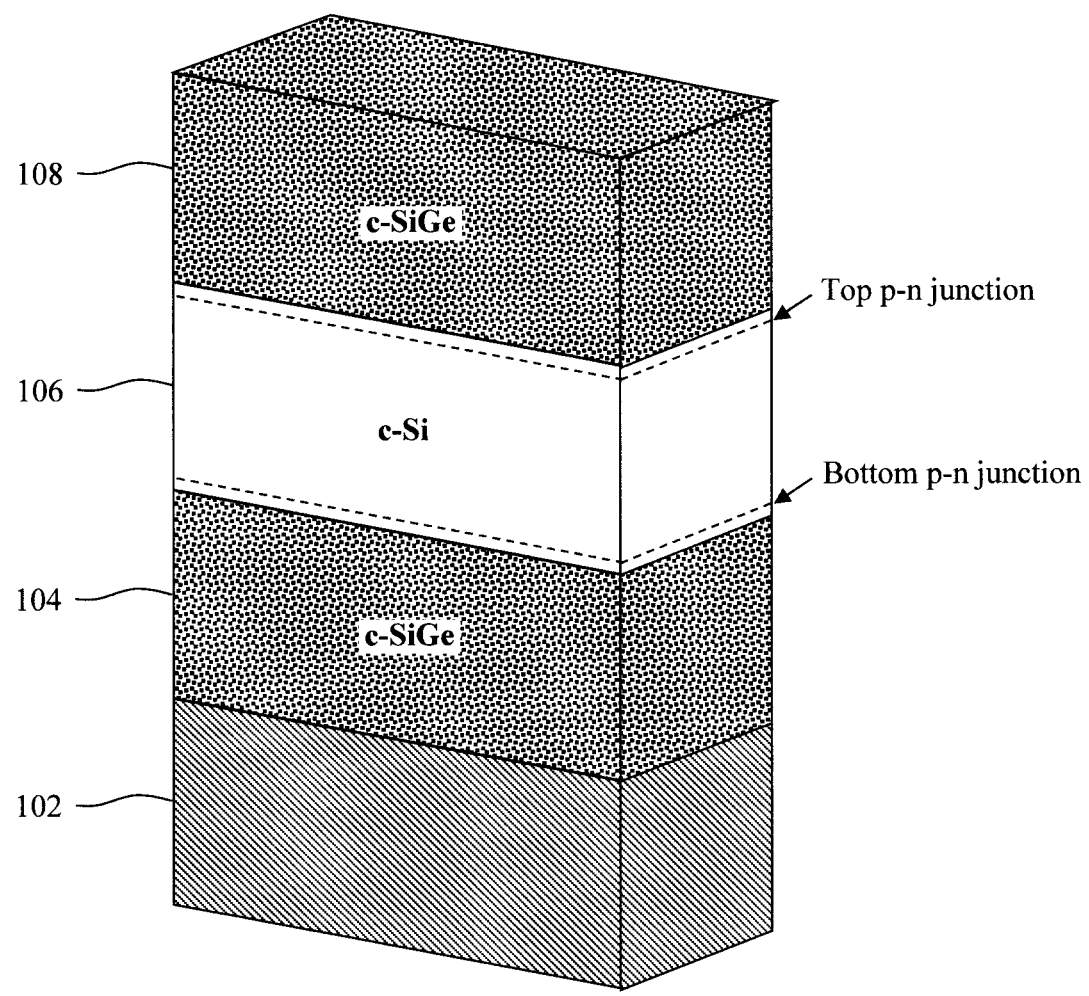
FIG. 1 is a three-dimensional diagram illustrating a stack having been formed on a wafer having a first crystalline silicon germanium (c-SiGe) layer disposed on the wafer, a crystalline silicon (c-Si) layer disposed on the first c-SiGe layer, and a second c-SiGe layer disposed on the c-Si layer according to an embodiment of the present invention.
Figure 2:
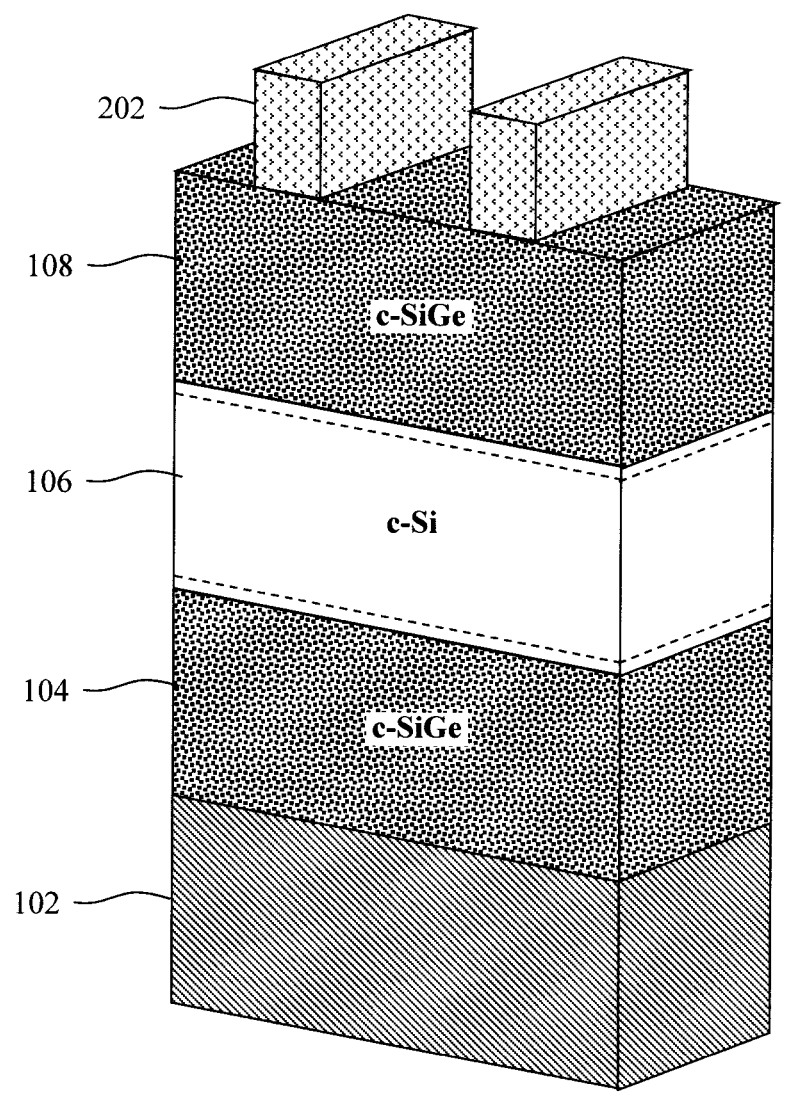
FIG. 2 is a three-dimensional diagram illustrating fin hardmasks having been formed on the stack according to an embodiment of the present invention.
Figure 3:
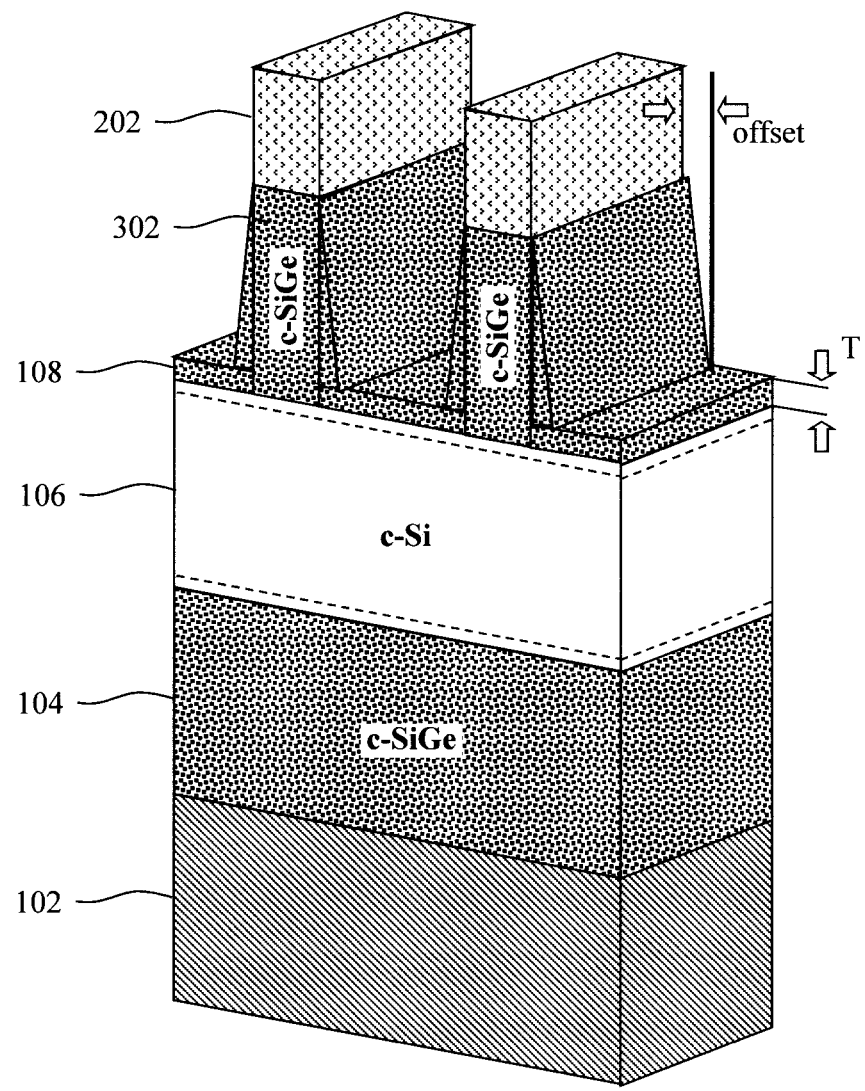
FIG. 3 is a three-dimensional diagram illustrating the fin hardmasks having been used to pattern at least one fin in the second c-SiGe layer, whereby the second c-SiGe layer is partially recessed during the fin etch according to an embodiment of the present invention.

An exemplary embodiment for forming a VTFET device in accordance with the present techniques is now described by way of reference to FIGS. 1-10. As shown in FIG. 1, the process begins with the formation of alternating layers 104-108 of a first crystalline material and a second crystalline material as a stack on a wafer 102.

According to an exemplary embodiment, wafer 102 is a bulk semiconductor wafer. Suitable bulk semiconductor wafers include, but are not limited to, bulk wafers of Si, strained Si, silicon carbide (SiC), germanium (Ge), SiGe, silicon-germanium-carbon (SiGeC), Si alloys, Ge alloys, gallium arsenide (GaAs), indium arsenide (InAs) and/or indium phosphide (InP).

Alternatively, wafer 102 can be a semiconductor-on-insulator (SOI) wafer. A 501 wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

The wafer 102 can include useful structures and devices (not shown) including, but not limited to, doping wells, isolation structures, capacitors, buried interconnects and/or transistors. Notably, these structures may set a limit on the thermal budget of fabrication processes. In one exemplary embodiment, VTFETs are used in 3D monolithic integrated circuits where multiple levels of VTFETs are sequentially built. In that case, the wafer 102 can already have a set of FETs incorporated within. Accordingly, the temperature-sensitive devices within wafer 102 may set a limit for high-temperature exposure and its duration for downstream processes.

In the example shown in FIG. 1, layers 104 and 108 are crystalline SiGe (c-SiGe) and layer 106 is crystalline Si (c-Si). According to an exemplary embodiment, a process such as Molecular Beam Epitaxy (MBE) or Chemical Vapor Deposition (CVD) is used to epitaxially grow each of the layers 104-108. For instance, c-SiGe layer 104 is grown on the wafer 102 by MBE or CVD, c-Si layer 106 is grown on the c-SiGe layer 104 by MBE or CVD, and so on. Forming epitaxial layers 104-108 can also include annealing steps for inducing or improving the crystallinity of these layers. Further, forming the c-SiGe layer 104 on wafer 102 can include first forming a crystalline seed layer over non-crystalline surfaces of wafer 102 by laser melt annealing techniques where, for example, the amorphous (not crystalline) layer is laser melted and then crystallized into a crystalline seed layer oftentimes with a polishing technique to smoothen the surface of the seed prior to epi growth. According to an exemplary embodiment, each of c-SiGe layer 104, c-Si layer 106 and c-SiGe layer 108 is formed having a thickness of from about 15 nanometers (nm) to about 40 nm and ranges therebetween, e.g., 20 nm.

According to an exemplary embodiment, c-SiGe layer 104 and c-SiGe layer 108 are doped with an n-type or p-type dopant. Suitable n-type dopants include, but are not limited to, phosphorous (P) and/or arsenic (As). Suitable p-type dopants include, but are not limited to, boron (B) and/or gallium (Ga). Doping the c-SiGe layer 104 and c-SiGe layer 108 with an n-type dopant results in the formation of an n-channel field effect transistor (NFET) VTFET device. Conversely, doping the c-SiGe layer 104 and c-SiGe layer 108 with a p-type dopant results in the formation of a p-channel field effect transistor (PFET) VTFET device. Preferably, the doping level in c-SiGe layer 104 and c-SiGe layer 108 is relatively high, e.g., from about $3\times10^{19}$ atoms/$cm^3$ to about $5\times10^{21}$ atoms/$cm^3$ and ranges therebetween, and can be graded throughout c-SiGe layer 104 and c-SiGe layer 108 to reduce lateral and contact resistances of and to these layers. C—Si layer 106 is lightly doped, e.g., from about $1\times10^{15}$ atoms/$cm^3$ to about $1\times10^{18}$ atoms/$cm^3$ and ranges therebetween, with the dopant polarity opposite to that of c-SiGe layer 104 and c-SiGe layer 108. This sets up p-n junctions near the interfaces of c-SiGe layer 104/c-Si layer 106 (bottom p-n junction) and c-SiGe layer 104/c-SiGe layer 108 (top p-n junction). The p-n junctions are advantageously located within c-Si layer 106 from about 1 nm to about 3 nm and ranges therebetween away from these interfaces. See FIG. 1. The doping level in portions of c-SiGe layer 104/c-SiGe layer 108 directly adjacent to c-Si layer 106 controls the exact position of the p-n junctions in c-Si layer 106 and can be used to tune the final physical overlap between the transistor junctions and the metal gate edges without any additional high-temperature, long-duration diffusion anneals. Doping of c-SiGe layer 104, c-Si layer 106 and c-SiGe layer 108 can be carried out in-situ (i.e., during growth) and/or ex-situ (e.g., by a process such as ion implantation and annealing).

It is notable that the germanium (Ge) percentage (%) of c-SiGe layer 104 and c-SiGe layer 108 can be tuned for different applications. Further, the Ge % can be graded throughout c-SiGe layer 104 and c-SiGe layer 108 and can be different for different transistor types. For example, it may be desirable to employ lower Ge % SiGe for NFET versus PFET devices, especially in the bulk of c-SiGe layer 104 and away from c-Si layer 106. Namely, a high Ge % for an NFET source/drain may result in high n-type dopant (e.g., phosphorous) diffusion and poor n-type dopant activation, and hence degraded transistor resistance and bad junction control. Thus, a lower Ge % is preferred for NFET source/drain and can even include pure Si incorporated into c-SiGe layer 104 and c-SiGe layer 108 away from c-Si layer 106.

For instance, according to an exemplary embodiment, for an NFET (where c-SiGe layer 104 and c-SiGe layer 108 are doped with an n-type dopant) c-SiGe layer 104 and c-SiGe layer 108 each preferably have a Ge % adjacent to c-Si layer 106 of from about 30% to about 60% and ranges therebetween but could have a lower Ge % in other portions of c-SiGe layer 104 and c-SiGe layer 108. By comparison, for an PFET (where c-SiGe layer 104 and c-SiGe layer 108 are doped with a p-type dopant) c-SiGe layer 104 and c-SiGe layer 108 each preferably have a Ge % adjacent to of c-Si layer 106 of from about 30% to about 60% and ranges therebetween (same as NFET) but could have a higher Ge % in other portions of c-SiGe layer 104 and c-SiGe layer 108. C-SiGe layer 104 and c-SiGe layer 108 can be grown by CVD from Si and Ge precursors such as silane ($SiH_4$) and germane ($GeH_4$), respectively. See, for example, Leitz et al., "Hole mobility enhancements and alloy scattering-limited mobility in tensile strained Si/SiGe surface channel metal-oxide-semiconductor field-effect transistors," Journal of Applied Physics, Vol. 92, No. 7, pp. 3745-3751 (October 2002), the contents of which are incorporated by reference as if fully set forth herein. Thus, the Ge % can be varied by varying the relative amounts of these precursors used during growth. Selecting a particular set of Si and Ge gaseous precursors can affect the CVD growth temperature. For instance, using disilane ($Si_2H_6$) and digermane ($Ge_2H_6$) as Si and Ge CVD precursors, respectively, reduces the CVD growth temperature to 400° C. and below (i.e., as compared to silane/germane in the example above).

As will be described in detail below, the c-SiGe layer 104 and c-SiGe layer 108 will be used to form the top and bottom source and drain. The c-Si layer 106 will be used to form the vertical channels.

Standard lithography and etching techniques are then used to form fin hardmasks 202 on the stack (i.e., on c-SiGe layer 108). See FIG. 2. Suitable materials for fin hardmasks 202 include, but are not limited to, nitride hardmask materials such as silicon nitride (SiN). Fin hardmasks 202 mark the footprint and location of at least one fin to be patterned in c-SiGe layer 108.

The fin hardmasks 202 are used to pattern at least one fin 302 in the c-SiGe layer 108. See FIG. 3. A directional (anisotropic) etching process such as reactive ion etching (RIE) can be employed for the fin etch. According to an exemplary embodiment, c-SiGe layer 108 is partially recessed during the fin etch. See, for example, FIG. 3 where a portion of c-SiGe layer 108 remains un-patterned (non-recessed) on the horizontal surfaces at the bottom of fins 302. By way of example only, the un-patterned (non-recessed) portion of c-SiGe layer 108 has a thickness T (see FIG. 3) of from about 3 nm to about 10 nm and ranges therebetween. Furthermore, the sidewalls of fins 302 can be made tapered to offset implantation lateral straggle (see below). Tapering causes the bottom edges of crystalline SiGe fin 302 to extend outward with respect to the edges of fin hardmasks 202. The degree of tapering defines the offset between the edges of fin hardmasks 202 and the bottom edges of the fins 302. See FIG. 3. In one exemplary embodiment, the offset is from about 3 nm to about 5 nm and ranges therebetween. In alternative embodiments, the offset can also be achieved by forming a spacer (not shown) on the sidewalls of fins 302.

Next, an amorphization implant is performed to form amorphous regions in c-Si layer 106 beneath the exposed portions of c-SiGe layer 108 (i.e., the portions of c-SiGe layer 108 not covered by fins 302). See FIG. 4A and FIG. 4B. In the examples depicted in both FIG. 4A and FIG. 4B, implanted ions will amorphize portions of the c-Si layer 106 not covered by the fin hardmasks 202 (i.e., unmasked regions). The result of this amorphization implant is the formation of amorphous Si (a-Si) regions 106' in between c-Si regions 106". In the example depicted in FIG. 4A, an ex-situ post implantation SPE anneal step is employed, whereas in the example depicted in FIG. 4B an in-situ (concurrent with the implantation) selective SPE anneal step is employed.

Figure 4A:
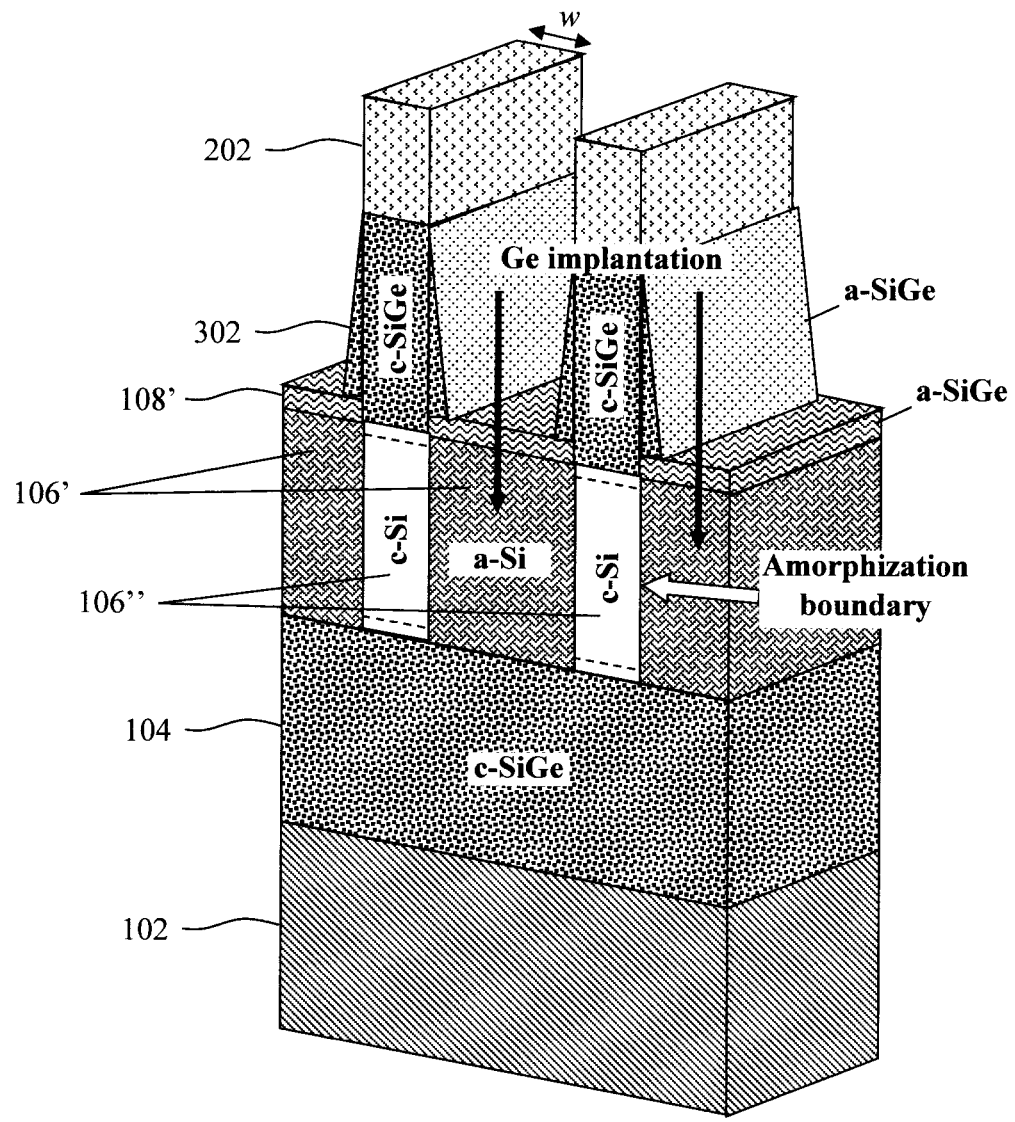
FIG. 4A is a three-dimensional diagram illustrating an amorphization implant with germanium (Ge) ions having been performed between the fin hardmasks to amorphize portions of the c-Si layer not covered by the fin hardmasks (to form amorphous Si (a-Si) regions in between c-Si regions) and an un-patterned non-recessed portion of the second c-SiGe layer (now an amorphous SiGe (a-SiGe) according to an embodiment of the present invention.
Figure 4B:
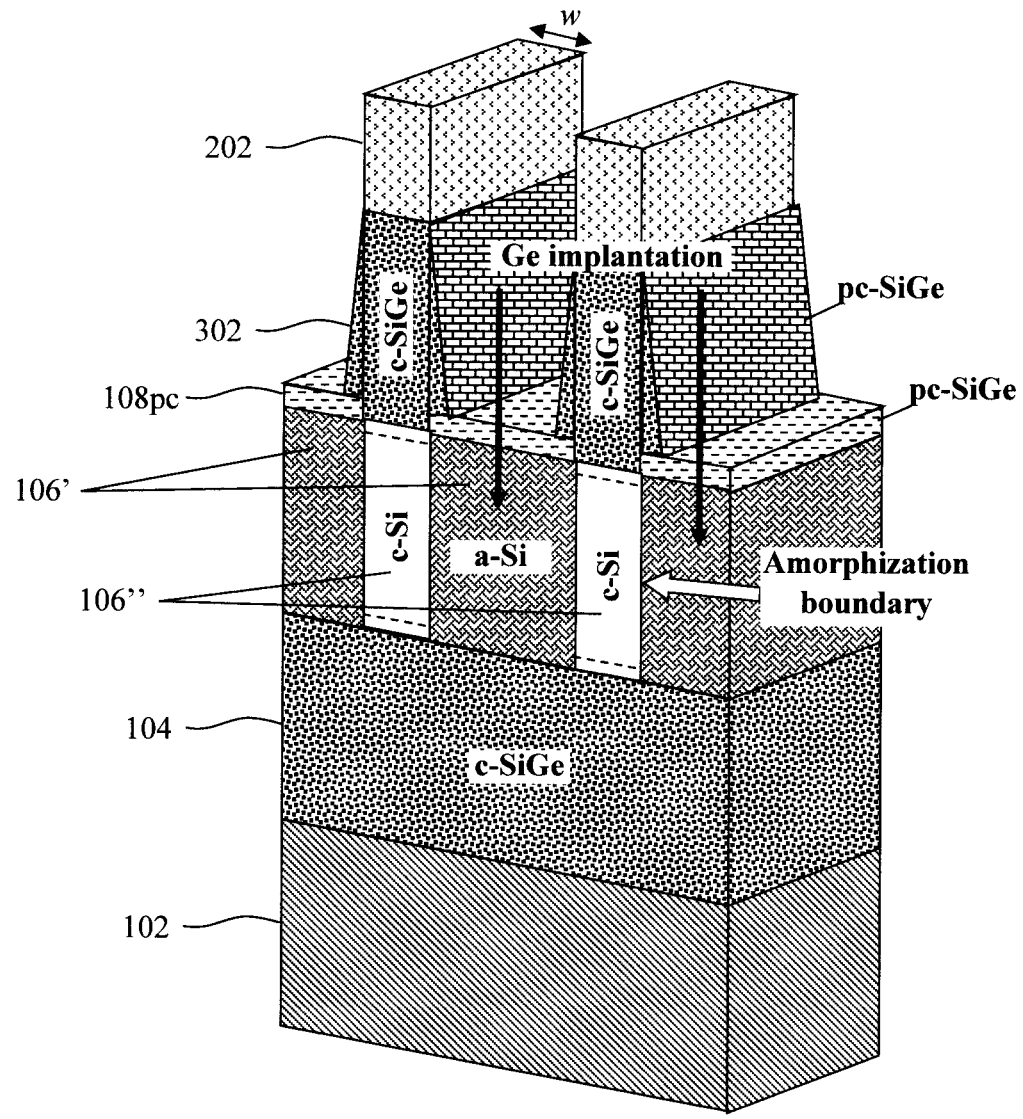
FIG. 4B is a three-dimensional diagram illustrating an amorphization implant with Ge ions having been performed between the fin hardmasks to amorphize portions of the c-Si layer not covered by the fin hardmasks (to form a-Si regions in between c-Si regions) and an un-patterned non-recessed portion of the second c-SiGe layer (now a partially crystalline SiGe (pc-SiGe) layer)) according to an embodiment of the present invention.

Referring first to FIG. 4A where an ex-situ post implantation SPE anneal step is employed, the un-patterned/non-recessed, exposed c-SiGe layer 108 (from the partial recess) and exposed tapered sidewalls of fin 302 will be also amorphized although this is not necessarily a desirable feature. See FIG. 4A. This will result in the formation of an amorphous SiGe (a-SiGe) layer 108' in between the fins 302 and an amorphous layer on tapered sidewalls of fins 302 tapered sidewalls. However, implantation into the c-Si regions 106" and the interior of fins 302 is blocked by the fin hardmasks 202, and thus these regions remain crystalline.

The implantation ions can be selected from heavy ions (i.e., ions with an atomic number Z greater than or equal to that of silicon, Z=14) having a neutral effect on the electrical conduction. Examples of such ions include, but are not limited to, silicon (Si), argon (Ar), germanium (Ge), krypton (Kr), and/or xenon (Xe). Ge ions are preferred due to their relatively high atomic number (Z=32), compatibility with the Si/SiGe material, and availability in common ion implantation tooling. The implanted dose is selected to cause the amorphization of c-Si layer 106. The implantation dose at which a particular target material (e.g., silicon) reaches full amorphization is known as the amorphization threshold dose. This amorphization threshold dose has a strong dependence on the implanted ion atomic number Z: a higher ion atomic number Z yields a lower amorphization threshold dose. For instance, the Ge amorphization threshold dose for silicon is from about $3 \times 10^{13}$ ions/cm$^2$ to about $1 \times 10^{14}$ ions/cm$^2$ and ranges therebetween. Accordingly, the suitable implantation dose for Ge ions is from about $1 \times 10^{14}$ ions/cm$^2$ to about $5 \times 10^{14}$ ions/cm$^2$ and ranges therebetween.

Preferably, the energy of ion implantation is selected to make the a-Si regions 106' have a target depth that is equal to or slightly larger than the thickness of layer 106. In order to ensure amorphization all the way to the bottom of layer 106, a small top portion of layer 104 directly underneath amorphous regions 106' can be inadvertently amorphized (not shown). For a given thickness of layer 106 and the depth of region 106', the implantation energy will depend on the atomic number Z of implanted ions and the thickness and composition of c-SiGe layer 108. For instance, an ion implantation energy of from about 10 kilo electron volt (keV) to about 20 keV and ranges therebetween is suitable for Ge ions and the target depth of the region 106' of about 20 nm. The volume concentration of implanted Ge ions does not exceed $5 \times 10^{20}$ cm$^{-3}$ or 1 atomic percent yielding no significant change in the chemical composition of implanted layers.

During ion implantation, ions embedded into a wafer scatter with some random angular component causing lateral displacement of the implanted ions. See, for example, Dr. Alan Doolittle, "Ion Implantation," Lecture 5, Georgia Tech, accessed online Jan. 25, 2019 (21 pages), the contents of which are incorporated by reference as if fully set forth herein. The characteristic spread of these implanted ions in a direction perpendicular to their arrival trajectory is what is referred to herein as 'lateral straggle.' For instance, for an implantation depth of 20 nm, Ge ion implantation may result in from about 3 nm to about 5 nm of lateral straggle causing a lateral enlargement of the amorphized a-Si regions 106', i.e., lateral amorphization encroachment. That is, the vertical amorphization boundary between the amorphized a-Si regions 106' and the c-Si regions 106" moves, e.g., from about 2 nm to about 4 nm past the outer edges of fins 302. Furthermore, the amorphization boundary will expand laterally more near the bottom of layer 106 (e.g., from about 2 nm to about 4 nm) and less near the top of layer 106 (e.g., from about 1 nm to about 2 nm).

In order to ensure that an adequate amount of crystalline material (i.e., c-Si regions 106") remains in between adjacent a-Si regions 106', the width of fin hardmasks 202 and the sidewall taper angle of fins 302 are selected to offset the lateral amorphization encroachment. To use an illustrative, non-limiting example to illustrate this concept, if the channel width target is from about 6 nm to about 7 nm (the minimum width of c-Si regions 106") and the channel length target is 20 nm (defined by the thickness of layer 106), then the width w of fin hardmasks 202 is selected to be from about 12 nm to about 15 nm to account for the implantation straggle and related lateral amorphization encroachment. Further, sidewall tapering of fins 302 can help offset top-to-bottom variance of the lateral implant straggle while providing an additional offset to compensate for the lateral amorphization encroachment. For instance, tapering the sidewalls of fins 302 by from about 5 degrees to about 10 degrees off normal makes the bottom thickness of fin 302 from about 4 nm to about 8 nm larger providing from about 2 nm to about 4 nm of additional offset to the amorphization encroachment. Alternatively or additionally, the thickness of c-Si layer 106 (e.g., channel length) can be reduced to from about 12 nm to about 16 nm to lower implantation energy, resulting in a smaller lateral implant straggle and reduced amorphization encroachment of from about 2 nm to about 3 nm.

Selective SPE is then employed to re-crystallize the a-SiGe layer 108' and any amorphous regions present in (SiGe) fins 302 and in the c-SiGe layer 104 (see above), forming c-SiGe 108" in between the fins 302, ensuring crystallinity throughout fins 302 and c-SiGe layer 104. Specifically, a-SiGe layer 108' and other a-SiGe regions, if any, are re-crystallized selective to the a-Si regions 106' such that, following formation of c-SiGe 108", a-Si regions 106' remain amorphous. See FIG. 5. As highlighted above, this selective re-crystallization process leverages the SPE temperature dependence differences for epitaxial re-crystallization of amorphous Si and amorphous SiGe. Namely, amorphous SiGe re-crystallizes at a lower temperature than amorphous Si, due to a different speed of SPE re-crystallization for amorphous SiGe and amorphous Si at a given temperature. Preferably, the temperature and duration of this selective SPE process is chosen such that the speed of amorphous Si re-crystallization is at least about 10 times lower, preferably about 30 times lower, than the re-crystallization speed of amorphous SiGe while the re-crystallization speed of amorphous SiGe is sufficient to fully re-grow a-SiGe from the crystalline seed (e.g., from fins 302) within the selected anneal duration.

The region of selectivity (i.e., the specified difference in SPE speeds) exists for a variety of SiGe compositions (Ge content) and anneal durations. Longer anneal durations such as rapid thermal annealing (RTA) (tens of seconds) and hot plate annealing (minutes) may result in highly selective processes (a large difference in SPE speeds). However, even short-duration annealing processes such as millisecond-scale laser or flash annealing can also provide enough selectivity. See, for example, Liu et al., "Dual Beam Laser Annealing for Contact Resistance Reduction and Its Impact on VLSI Integrated Circuit Variability," 2017 Symposium on VLSI Technology (June 2017) (2 pages) (hereinafter "Liu"), the contents of which are incorporated by reference as if fully set forth herein.

According to an exemplary embodiment, the SPE is carried out using millisecond (mSec) laser spike annealing (LSA) at a peak temperature of less than or equal to about 800 degrees Celsius (° C.), e.g., from about 750° C. to about 800° C. and ranges therebetween. The duration of such mSec anneals can be from about 0.1 milliseconds (msec) to about 10 msec as measured at 50° C. below the peak temperature. For instance, an amorphous $SiGe_x$ layer 10 nm thick, wherein X is from about 0.4 to about 0.5, fully re-crystallizes at temperatures above 700° C. On the other hand, an amorphous Si layer of the same thickness re-crystallizes at higher temperatures, i.e., temperatures above 850° C. Thus, employing temperatures of less than or equal to about 800° C. (e.g., from about 750° C. to about 800° C. and ranges therebetween) for the SPE anneal of a-SiGe layer 108' will result in re-crystallization to form c-SiGe layer 108" while a-Si regions 106' remain amorphous. See FIG. 5.

Other mSec anneals such as, but not limited to, flash lamp anneals and dual beam laser anneals can also be employed herein for selective SPE as long as they provide the desired difference in SPE re-crystallization speeds between a-Si and a-SiGe. The choice of selective SPE anneal type (e.g., mSec anneal versus RTA versus hot plate annealing) is dictated, at least in part, by temperature sensitive structures that maybe present in the underlying wafer 102. For instance, millisecond anneals are particular useful for temperature sensitive structures such as in the case of three-dimensional transistor stacking.

As provided above, alternatively the selective SPE step may be aided and, in some cases, replaced with a selective amorphization implant. See FIG. 4B. In this case, the selective amorphization implant process employs an in-situ (concurrent with the implantation) selective SPE anneal step as opposed to an ex-situ, post implantation SPE anneal step. The advantage of such in-situ selective SPE step is that it can be conducted at a lower temperature. Each individual implanted ion creates a small amorphous volume or pocket in its path in both the c-Si and c-SiGe materials. This small amorphous pocket re-crystallizes fast in SiGe material healing itself before the next ion creates an additional amorphous pocket in its vicinity while, in the c-Si material, the amorphous pocket does not fully heal itself prior to forming additional amorphous pockets in its vicinity. Notably, the speed of re-crystallizing small amorphous pockets created by individual ions is much faster than that of re-crystallizing continuous amorphous layers, enabling a selective re-crystallization process at much lower temperatures. Such an in-situ selective re-crystallization process leads to a quick accumulation and coalescence of amorphous pockets from individual implanted ions in the Si material and a delayed accumulation of amorphous pockets from individual implanted ions in the SiGe material. After such selective amorphization implant with in-situ selective SPE re-growth, the un-patterned/non-recessed exposed c-SiGe layer 108 (from the particle recess)—here given the reference numeral 108pc—remains partially crystalline (pc-SiGe) (as opposed to a-SiGe as in the example of FIG. 4A above) while the layer 106' is fully amorphous. See FIG. 4B. The in-situ selective SPE re-growth can be achieved by conducting ion implantation at an elevated substrate temperature as opposed to a more typical case when the ion implantation is conducted at room temperature. The ion implantation substrate temperature is chosen to yield significantly different amorphization threshold doses for silicon and silicon germanium. Amorphization selectivity is achieved by selecting implantation dose to be in between different amorphization threshold doses for Si and SiGe. For instance, by way of example only, a Ge implantation dose of $5 \times 10^{14}$ cm$^{-2}$ at a substrate temperature of from about 100° C. to about 300° C. and ranges therebetween is amorphizing for Si but only partially amorphizing for SiGe with a Ge content of greater than 50%. Notably, the substrate temperature for this in-situ selective SPE process is much lower than the temperature of from about 400° C. to about 550° C. and ranges therebetween required for re-crystallizing a fully amorphous layer 108' using hot plate annealing (an ex-situ selective SPE process). Nevertheless, the partially crystalline pc-SiGe layer 108pc produced with in-situ selective SPE process may require an additional anneal step to heal the residual defects in partially crystalline pc-SiGe layer 108pc converting to the fully crystalline layer 108". This additional anneal step replaces the ex-situ SPE anneal step and has the same high temperature limit for keeping layer 106' amorphous and an extended low temperature limit because the partially crystalline pc-SiGe layer 108pc is easier to fully re-crystallize and it does not require any proximity of the crystalline seed (e.g., the fin 302).

Figure 5:
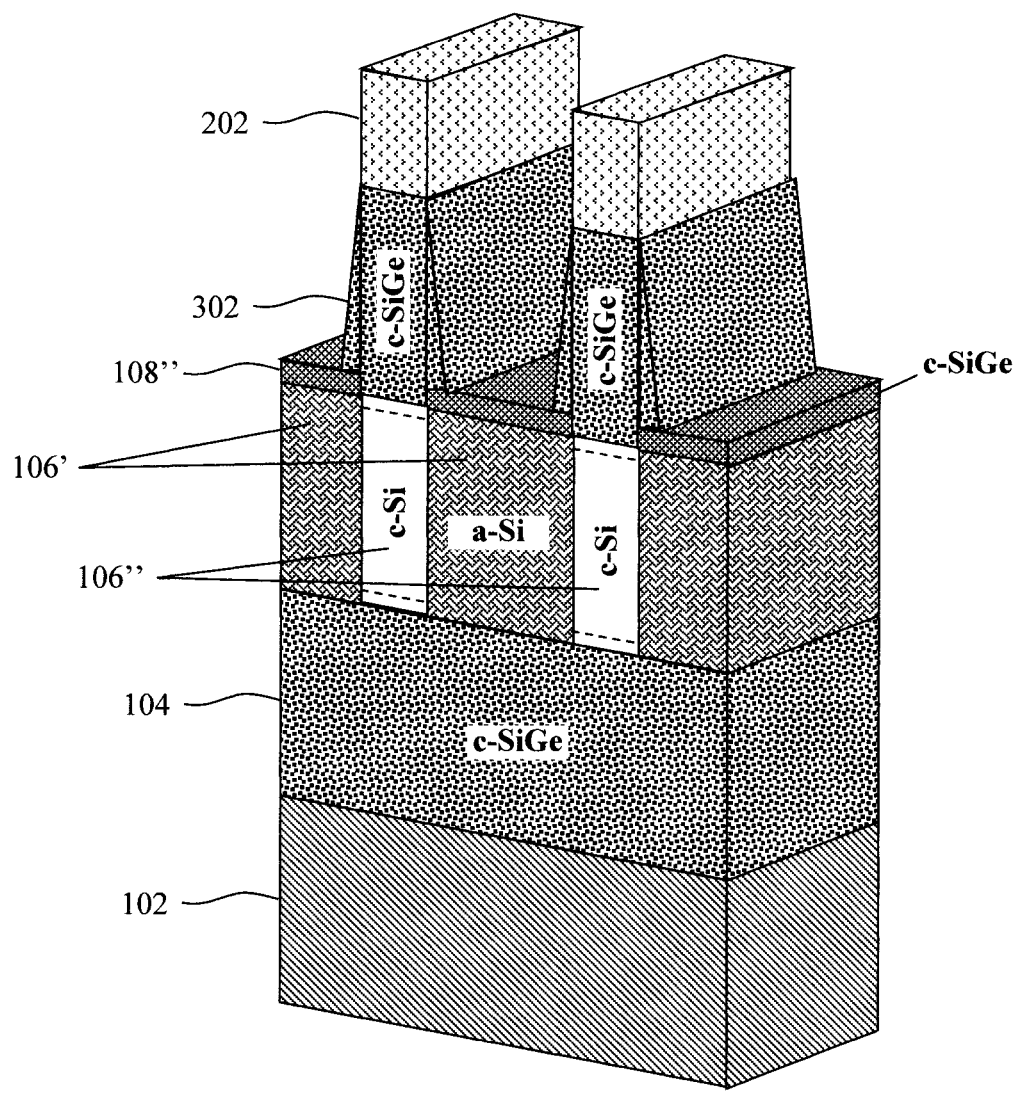
FIG. 5 is a three-dimensional diagram illustrating solid phase epitaxy (SPE) having been employed to fully re-crystallize the a-SiGe or pc-SiGe layer, while the a-Si regions remain amorphous according to an embodiment of the present invention.
Figure 6:
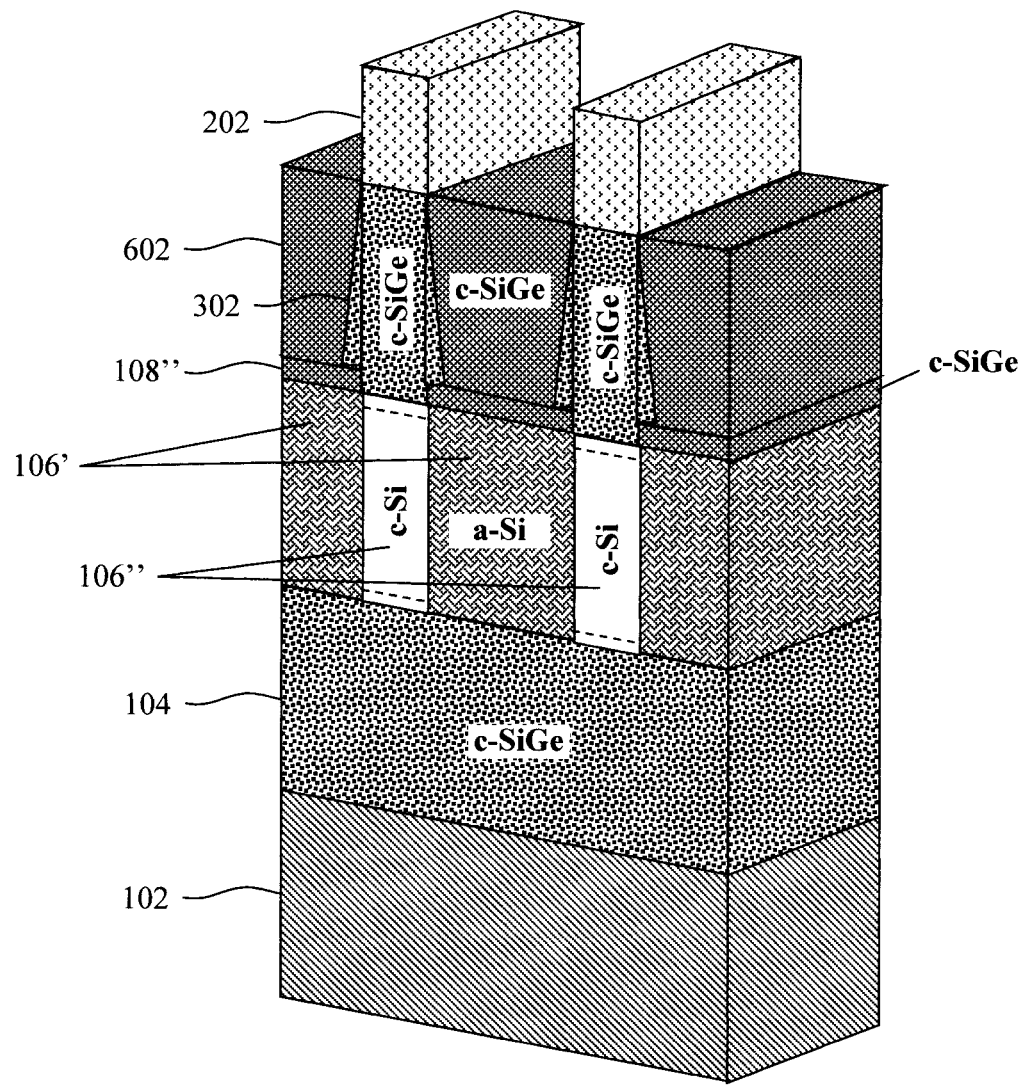
FIG. 6 is a three-dimensional diagram illustrating the portion of the second c-SiGe layer removed by the partial recess having been regrown according to an embodiment of the present invention.

As a result of conducting the amorphization implant and SPE anneals (in-situ and/or ex-situ), both directed to selectively forming a-Si regions 106' and c-SiGe layer 108", the inverted structure shown in FIG. 5 is obtained with a crystalline SiGe layer 108" located above amorphous Si layer 106'. This inverted structure enables further fabrication steps that otherwise would not be possible to perform.

Optionally, next, the portion of c-SiGe layer 108 removed by the partial recess (see above) is now regrown on top of c-SiGe layer 108" using c-SiGe layer 108" as a crystalline seed for a gas-phase epitaxy process. See c-SiGe 602 in FIG. 6. The regrowth of c-SiGe 602 is beneficial because having more top source/drain volume provides a higher top source/drain dopant concentration for junction control and good contact resistivity, as well as more top source/drain contact area.

It is notable that the Ge % of c-SiGe 602 can be tuned for different applications. Further, the Ge % can be graded throughout layer 602 and can be different for different transistors types. For example, it may be desirable to employ lower Ge % SiGe for NFET versus PFET devices, especially away from the layer 108". Namely, a high Ge % for an NFET source/drain may result in poor n-type dopant activation and hence degraded transistor resistance. Thus, a lower % Ge is preferred for NFET source/drains and can include pure Si incorporated into c-SiGe 602 away from the layer 108". Conversely, it may be desirable to employ a higher Ge % SiGe for PFET devices, especially away from the layer 108". Namely, a high Ge % for PFET source/drains may result in good contact resistance to such p-type layer and hence improved transistor resistance. Thus, a higher % Ge is preferred for PFET source/drains and may include high Ge % SiGe (i.e., from about 60% to about 100% and ranges therebetween) and pure Ge incorporated into c-SiGe 602 away from the layer 108".

According to an exemplary embodiment, c-SiGe 602 is formed using a low-temperature MBE or CVD epitaxial process so as not to crystallize a-Si region 106'. Preferably, the temperature of such epitaxial process is kept at or below 400° C. to prevent any crystallization within a-Si regions 106'. Such low temperatures can be achieved in a CVD reactor utilizing digermane (Ge$_2$H$_6$) and disilane (Si$_2$H$_6$) as germanium and silicon precursors, respectively. Optionally, the Ge % in c-SiGe 602 can be different than the Ge % in c-SiGe layer 108", as provided above.

As above, c-SiGe 602 can be in-situ or ex-situ doped with an n-type (e.g., P and/or As) or p-type (e.g., B and/or Ga) dopant, depending on whether an NFET or PFET device is being formed. Further, as provided above, the Ge % of c-SiGe 602 can be tuned such as to enable low-resistance structures and low-temperature processes that are compatible with keeping a-Si regions 106' amorphous. However, it is possible to grow a lower Ge % (e.g., from about 0% to about 60% and ranges therebetween) for an NFET and a higher Ge % (e.g., from about 60% to about 100% and ranges therebetween) for a PFET using digermane (Ge$_2$H$_6$) and disilane (Si$_2$H$_6$) as germanium and silicon precursors, respectively, at low growth temperatures (e.g., at or below 400° C.).

In an alternative embodiment, c-SiGe 602 is deposited at very low temperatures (e.g., at room temperature) by physical vapor deposition (PVD), MBE, or other suitable technique in its amorphous form, and then converted into the crystalline form by a selective SPE anneal performed in the same manner as the SPE anneal described above for converting a-SiGe layer 108' to c-SiGe layer 108" selective to a-Si regions 106'. Next, the a-Si regions 106' are removed selective to the crystalline Si/SiGe regions (i.e., c-SiGe layer 104, c-Si regions 106", fins 302, and c-SiGe 602). See FIG. 7. As provided above, the present techniques leverage etch selective removal of a-Si over c-Si/c-SiGe to open a self-aligned gate region along the vertical channel. For instance, a wet etchant such as dilute hydrogen fluoride (DHF)+ammonium hydroxide (NH$_4$OH)/water (H$_2$O) can be used to remove a-Si selective to c-Si/c-SiGe.

Figure 7:
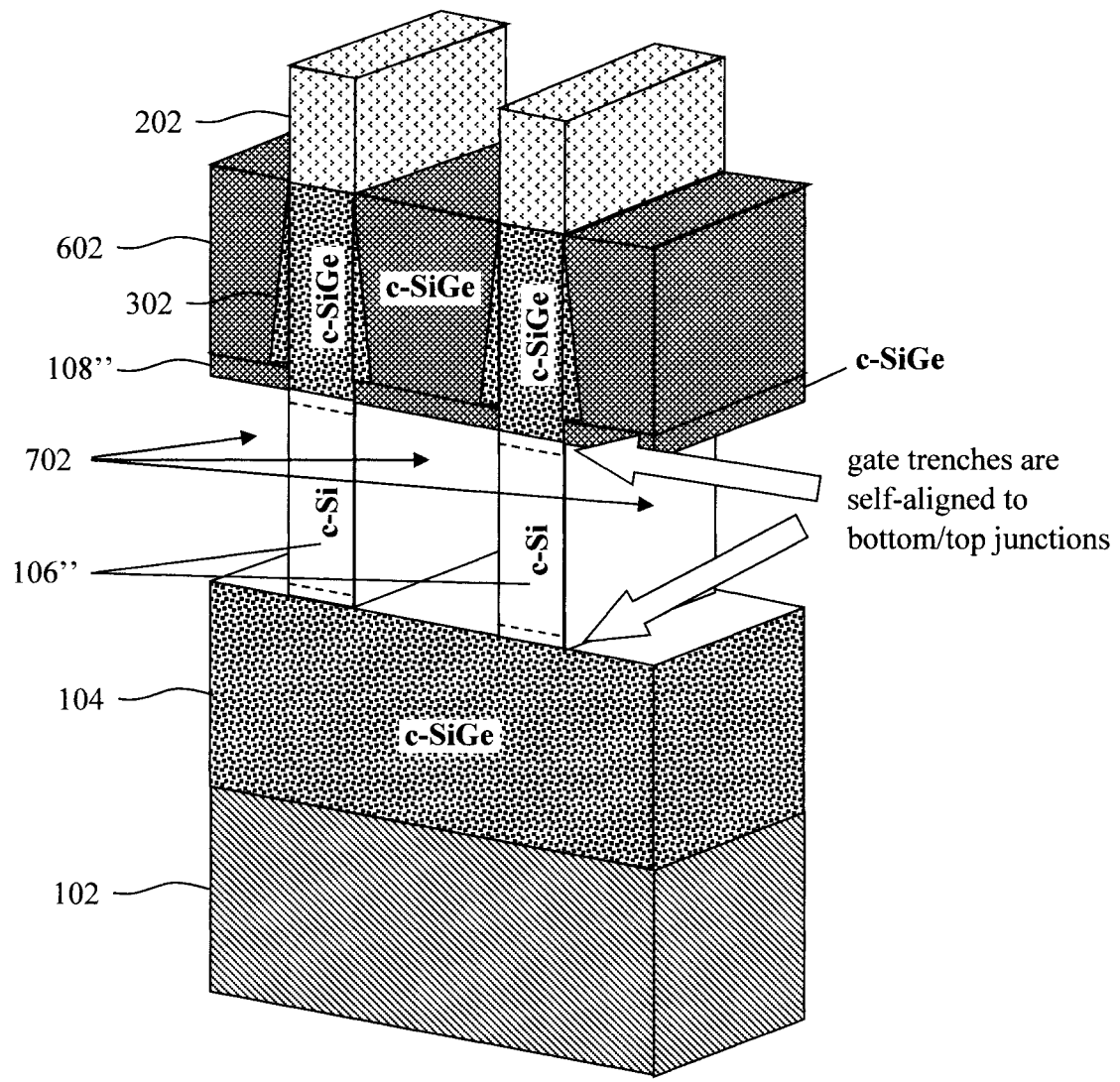
FIG. 7 is a three-dimensional diagram illustrating the a-Si regions having been removed selective to the crystalline Si/SiGe regions, forming gate trenches alongside the c-Si regions (i.e., vertical channels) according to an embodiment of the present invention.

As shown in FIG. 7, selective removal of a-Si regions 106' results in the formation of gate trenches 702 alongside c-Si regions 106" which serve as the vertical channels of the VTFET device. Notably, since the gate trenches 702 and c-Si regions 106"/vertical channels are formed in the same original layer in the stack (i.e., c-Si layer 106), the gate trenches 702 are self-aligned at the tops and bottoms of the vertical channels. As a result, the gates to be formed in the gate trenches will be self-aligned with the top and bottom junctions, i.e., the junction of the vertical channel and the bottom/top source and drains. Self-alignment of the bottom/top source and drain junctions to the gate eliminates the need for any high-temperature (e.g., higher than about 800° C.) and long-duration (e.g., longer than about 1 second) diffusion anneals required for creating a physical overlap between the junctions and the gate. This, in turn, provides compatibility with temperature-sensitive structures that may be present in wafer 102.

Figure 8:
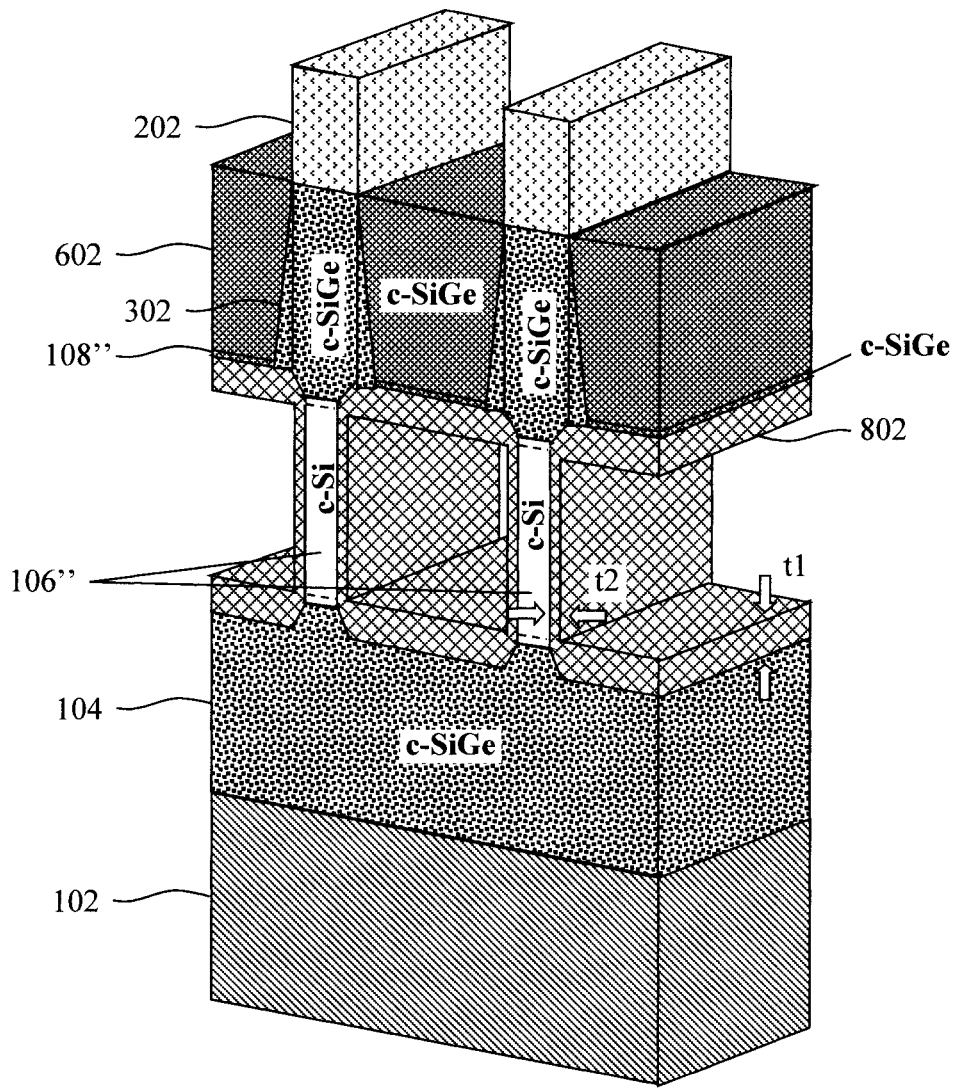
FIG. 8 is a three-dimensional diagram illustrating a thermal oxide having been formed preferentially on SiGe surfaces of the gate trenches according to an embodiment of the present invention.
Figure 9:
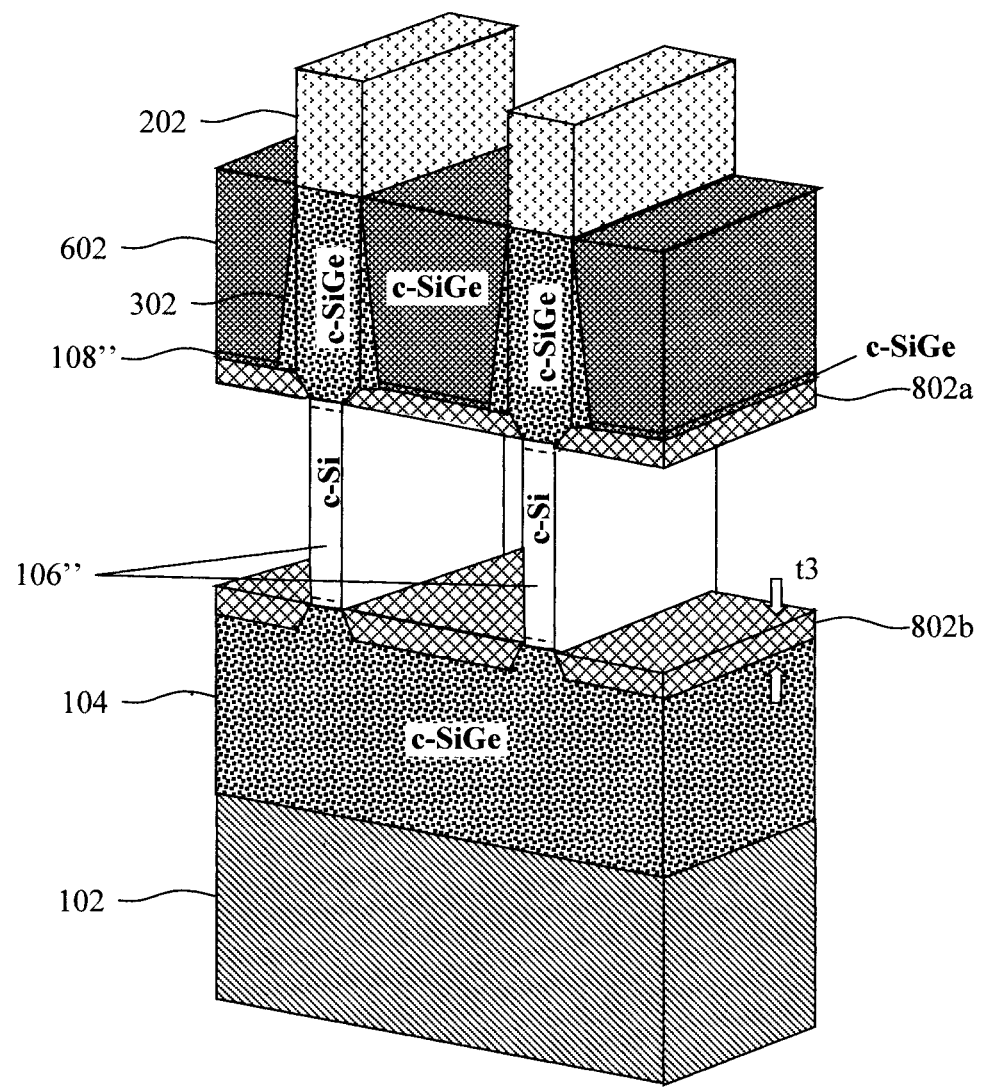
FIG. 9 is a three-dimensional diagram illustrating the thermal oxide having been cleared from the Si surfaces of the gate trenches to form bottom and top spacers according to an embodiment of the present invention.

Next, a selective oxidation process is used to form bottom and top spacers in the gate trenches 702. The bottom and top spacers serve to offset the bottom and top source and drains from the gate. As highlighted above, the present techniques leverage preferential (low-temperature) oxidation of SiGe over Si to form the bottom and top spacers. Namely, as shown in FIG. 8, thermal oxidation is used to form a thermal oxide 802 (e.g., silicon dioxide ($SiO_2$)). According to an exemplary embodiment, the thermal oxidation is carried out at a temperature of less than or equal to about 600° C., e.g., from about 400° C. to about 600° C. and ranges therebetween.

The selective oxidation of SiGe over Si is described, for example, in Tanaka et al., "Abnormal oxidation characteristics of SiGe/Si-on-insulator structures depending on piled-up Ge fraction at $SiO_2$/SiGe interface," Journal of Applied Physics vol. 103, issue 5, 054909 (March 2008) (5 pages) (hereinafter "Tanaka"), the contents of which are incorporated by reference as if fully set forth herein. For instance, as provided in Tanaka, even with 25% Ge % SiGe, the oxidation rate of SiGe can be 20× that of Si at temperatures less than or equal to about 650° C.

Based on the preferential oxidation of SiGe over Si, a greater amount of the thermal oxide 802 forms on the SiGe surfaces of gate trenches 702 (i.e., on c-SiGe layer 104/c-SiGe 108") as opposed to the Si surfaces (i.e., c-Si regions 106"). For instance, according to an exemplary embodiment, thermal oxide 802 is formed on the SiGe surfaces of trenches 702 to a thickness t1 of from about 5 nm to about 8 nm and ranges therebetween (e.g., 6 nm), while the thermal oxide 802 is formed on the Si surfaces of trenches 702 to a thickness t2 of from about 0.5 nm to about 3 nm and ranges therebetween, e.g., 1 nm. See FIG. 8.

Using this thickness difference t1 versus t2, an etch can be used to clear thermal oxide 802 from the Si surfaces, while thermal oxide 802 remains on the SiGe surfaces since a greater amount of thermal oxide 802 was formed on the SiGe surfaces to begin with. See FIG. 9. The thermal oxide 802 that remains on the SiGe surfaces forms the top and bottom spacers 802a and 802b, respectively. A pre-clean process such as a diluted RCA clean with oxide removal (e.g., via diluted aqueous HF or a chemical reactive oxide removal COR process) can be used to clear thermal oxide 802 from the Si surfaces. While thinning of the thermal oxide 802 occurs on the SiGe surfaces, this effect is minimal. For instance, according to an exemplary embodiment, post preclean the bottom and top spacers 802a and 802b each have a thickness t3 of from about 4 nm to about 7 nm and ranges therebetween, e.g., 5 nm. See FIG. 9.

The fin hardmasks 202 are removed using a polishing process such as chemical mechanical polishing (CMP), and gates 1002 are formed in the trenches 702 alongside the c-Si regions 106"/vertical channels. See FIG. 10.

Figure 10:
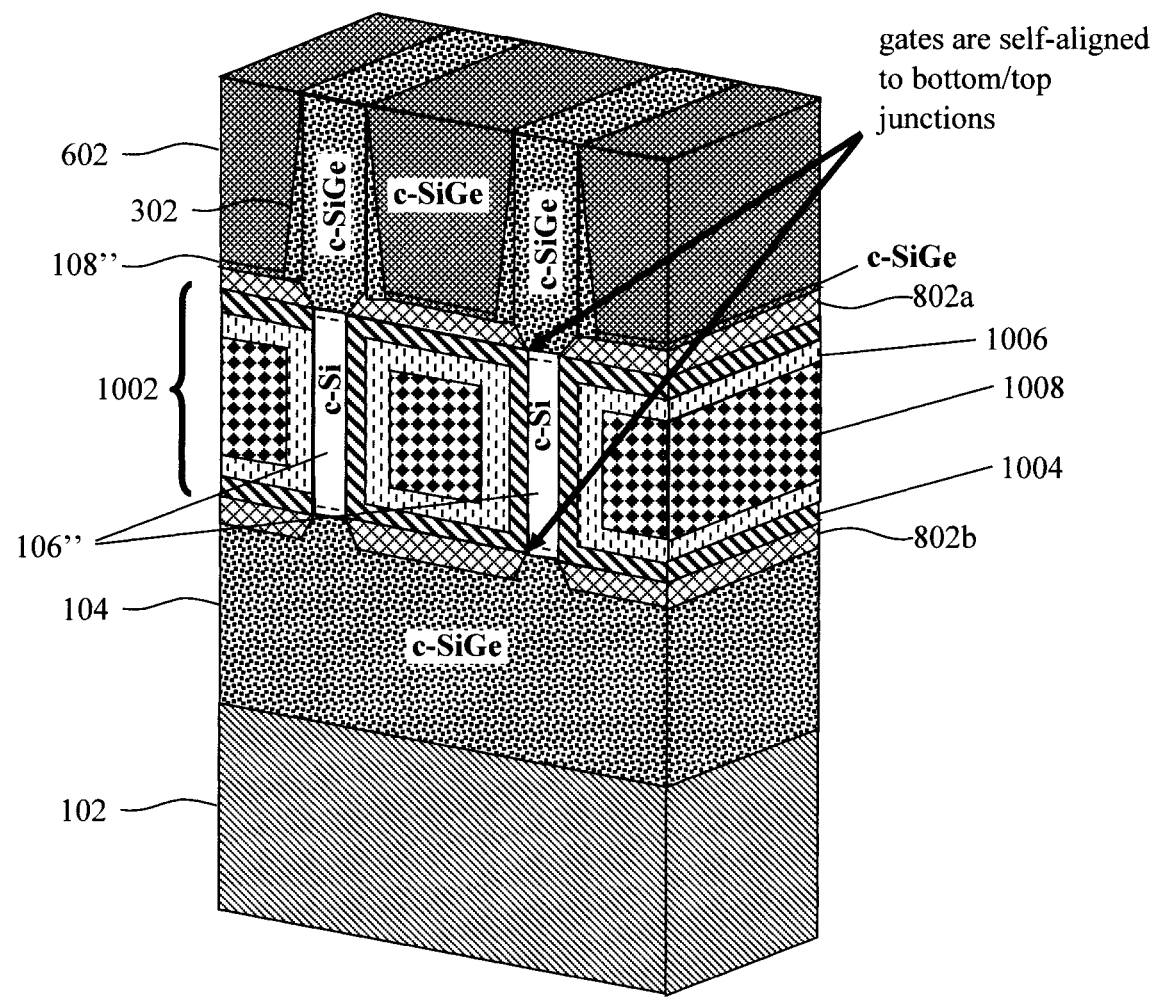
FIG. 10 is a three-dimensional diagram illustrating a conformal gate dielectric having been deposited into and lining the gate trenches and alongside the c-Si regions (vertical channels), a conformal workfunction setting metal having been deposited into the gate trenches on the gate dielectric, and a fill metal having been deposited into/filling the gate trenches on the workfunction setting metal to form gates that are self-aligned to the bottom and top source/drain-to-channel junctions according to an embodiment of the present invention.

For instance, as shown in FIG. 10 a conformal gate dielectric 1004 is deposited into and lining the gate trenches 702 and alongside the c-Si regions 106"/vertical channels. Suitable gate dielectrics 1004 include, but are not limited to, high-κ gate dielectrics such as hafnium oxide ($HfO_2$) and/or lanthanum oxide ($La_2O_3$). The term "high-κ" as used herein refers to a material having a relative dielectric constant κ which is much higher than that of silicon dioxide (e.g., a dielectric constant κ=25 for hafnium oxide ($HfO_2$) rather than 4 for $SiO_2$). The gate dielectric 1004 can be deposited using a process such as chemical vapor deposition (CVD), atomic layer deposition (ALD) or physical vapor deposition (PVD). According to an exemplary embodiment, gate dielectric 1004 is deposited to a thickness of from about 2 nm to about 10 nm and ranges therebetween. It is notable that, prior to depositing the gate dielectric 1004, a thin interfacial layer (IL) oxide (not shown) (e.g., $SiO_2$ which may include other chemical elements in it such as nitrogen, germanium, etc.) is first formed on exposed surfaces of c-Si regions 106"/vertical channels. According to an exemplary embodiment, the IL oxide is formed by an oxidation process to a thickness of from about 0.3 nm to about 5 nm, and ranges therebetween, e.g., about 1 nm. In that case, the conformal gate dielectric 1004 is deposited alongside the c-Si regions 106"/vertical channels over the IL oxide.

At this stage, the transistor structure can undergo an optional high-temperature, short-duration anneal to improve the properties of the gate dielectric 1004 and to provide extra activation of the dopants in the bottom/top source and drains. According to an exemplary embodiment, this anneal is performed at a temperature of from about 900° C. to about 1300° C. and ranges therebetween, for a duration of less than about 1 millisecond, preferably less than about 1 microsecond at 50° C. below the peak temperature. In one exemplary embodiment, this short-duration anneal is a laser anneal. It is the short duration that makes this anneal compatible with temperature-sensitive structures that may be present in wafer 102.

A conformal workfunction setting metal 1006 is then deposited into the gate trenches 702 on the gate dielectric 1004. The particular workfunction setting metal employed can vary depending on whether an n-type or p-type transistor is desired. Suitable n-type workfunction setting metals include, but are not limited to, TiN, TaN and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction setting metals include, but are not limited to, TiN, TaN, and/or tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

A process such as CVD, ALD, PVD, electroplating, evaporation, sputtering, etc. can be used to deposit the workfunction setting metal 1006. According to an exemplary embodiment, the workfunction setting metal 1006 is deposited to a thickness of from about 5 nm to about 20 nm and ranges therebetween.

Finally, a fill metal 1008 is deposited into/filling the gate trenches 702 on the workfunction setting metal 1006. Suitable fill metals include, but are not limited to, tungsten (W) and/or cobalt (Co). A process such as CVD, ALD, PVD, electroplating, evaporation, sputtering, etc. can be used to deposit the fill metal 1008.

The c-SiGe layer 104 serves as the bottom source and drain, and c-SiGe 108"/fins 302/c-SiGe 602 serve as the top source and drain. As shown in FIG. 10, the gates 1002 are self-aligned to the bottom and top source/drain-to-channel junctions. As provided above, this self-aligned configuration results from the unique process described herein whereby the gate trenches 702 (in which the gates 1002 are formed) and c-Si regions 106"/vertical channels are formed in the same original layer in the stack (i.e., c-Si layer 106). Furthermore, the self-aligned configuration did not employ any high-temperature, long-duration diffusion anneals that are required for creating a physical overlap between the junctions and the gates 1002. Gates 1002 are isolated from the top and bottom source and drains by the top and bottom spacers 802a and 802b, respectively.

As shown in FIG. 10, the present VTFET device has c-SiGe layer 104 (i.e., the bottom source and drain) disposed on wafer 102, c-Si regions 106"/vertical channels disposed on the c-SiGe layer 104, and c-SiGe 108" partially recessed with fins 302 formed therein (and optional regrowth c-SiGe 602) (i.e., the top source and drain). Gate trenches 702 are self-aligned with the c-Si regions 106"/vertical channels between the bottom and top source and drains. The bottom and top spacers 802a and 802b are disposed in the gate trenches 702, and gates 1002 are formed in the gate trenches 702 alongside the c-Si regions 106"/vertical channels and isolated from the bottom source and drains by the top and bottom spacers 802a and 802b.

The VTFET device shown in FIG. 10 can be wired into an integrated circuit by removing an excess workfunction setting metal 1006/fill metal 1008 from the areas adjacent to the VFET devices, isolating individual VFET devices with an interlayer dielectric material, forming independent electrical contacts to the c-SiGe layer 104 (i.e., bottom source/drains), to the fins 302/c-SiGe 602 (i.e., top source/drains), and to the workfunction setting metal 1006/fill metal 1008, and wiring these contacts via a network of metallic interconnects.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a vertical transport field-effect transistor (VTFET) device, the method comprising the steps of:
    forming a stack on a wafer, the stack comprising a first crystalline silicon germanium (c-SiGe) layer disposed on the wafer, a crystalline silicon (c-Si) layer disposed on the first c-SiGe layer, and a second c-SiGe layer disposed on the c-Si layer, wherein the first c-SiGe layer comprises a bottom source and drain of the VTFET device;
    forming fin hardmasks on the stack;
    partially recessing the second c-SiGe layer using the fin hardmasks to form at least one fin in the second c-SiGe layer, wherein the second c-SiGe layer that is partially recessed and the at least one fin comprise a top source and drain of the VTFET device;
    amorphizing the c-Si layer in between the fin hardmasks to form amorphous Si (a-Si) regions in between c-Si regions, wherein the c-Si regions comprise vertical channels of the VFET device;
    selectively removing the a-Si regions to form gate trenches self-aligned with the vertical channels;
    forming bottom spacers and top spacers in the gate trenches; and
    forming gates in the gate trenches alongside the vertical channels, wherein the gates are isolated from the bottom source and drain and the top source and drain by the bottom spacers and the top spacers.

2. The method of claim 1, wherein the first c-SiGe layer and the second c-SiGe layer are doped with an n-type dopant.

3. The method of claim 1, wherein the first c-SiGe layer and the second c-SiGe layer are doped with a p-type dopant.

4. The method of claim 1, wherein the amorphizing step comprises the step of:
    performing an amorphization implant into the c-Si layer in between the fin hardmasks.

5. The method of claim 4, wherein the amorphization implant is performed with germanium (Ge) ions.

6. The method of claim 1, wherein a non-recessed portion of the second c-SiGe layer which remains on horizontal surfaces following the partially recessing step is amorphized during the amorphizing step, the method further comprising the step of:
    selectively recrystallizing the non-recessed portion of the second c-SiGe layer using solid phase epitaxy (SPE) while keeping the a-Si regions amorphous.

7. The method of claim 1, wherein a non-recessed portion of the second c-SiGe layer which remains on horizontal surfaces following the partially recessing step remains partially crystalline during the amorphizing step to form the a-Si regions in between c-Si regions.

8. The method of claim 1, further comprising the step of:
    regrowing a portion of the second c-SiGe layer removed during the partially recessing step using molecular beam epitaxy (MBE) or chemical vapor deposition (CVD).

9. The method of claim 1, wherein the step of forming the bottom spacers and top spacers in the gate trenches comprises:
    forming a thermal oxide in the gate trenches, wherein the thermal oxide is formed in the gate trenches having a thickness t1 on SiGe surfaces and a thickness t2 on Si surfaces, and wherein t1>t2; and
    removing the thermal oxide from the Si surfaces, while the thermal oxide remains on the SiGe surfaces as the bottom spacers and top spacers.

10. A method of forming a VTFET device, the method comprising the steps of:
    forming a first c-SiGe layer on a wafer using MBE or CVD;
    forming a c-Si layer on the first c-SiGe layer using MBE or CVD;
    forming a second c-SiGe layer on the c-Si layer using MBE or CVD, wherein the first c-SiGe layer, the c-Si layer, and the second c-SiGe layer are formed as a stack on the wafer, wherein the first c-SiGe layer comprises a bottom source and drain of the VTFET device;
    forming fin hardmasks on the stack;
    partially recessing the second c-SiGe layer using the fin hardmasks to form at least one fin in the second c-SiGe layer, wherein the second c-SiGe layer that is partially recessed and the at least one fin comprise a top source and drain of the VTFET device;
    amorphizing the c-Si layer in between the fin hardmasks to form a-Si regions in between c-Si regions, wherein the c-Si regions comprise vertical channels of the VFET device, and wherein the amorphizing comprises performing an amorphization implant into the c-Si layer in between the fin hardmasks;
    selectively removing the a-Si regions to form gate trenches self-aligned with the vertical channels;
    forming bottom spacers and top spacers in the gate trenches; and
    forming gates in the gate trenches alongside the vertical channels, wherein the gates are isolated from the bottom source and drain and the top source and drain by the bottom spacers and the top spacers.

11. The method of claim 10, wherein the first c-SiGe layer and the second c-SiGe layer are doped with an n-type dopant.

12. The method of claim 10, wherein the first c-SiGe layer and the second c-SiGe layer are doped with a p-type dopant.

13. The method of claim 10, wherein the amorphization implant is performed with Ge ions.

14. The method of claim 10, wherein a non-recessed portion of the second c-SiGe layer which remains on horizontal surfaces following the partially recessing step is amorphized during the amorphizing step, the method further comprising the step of:
  selectively recrystallizing the non-recessed portion of the second c-SiGe layer using SPE while keeping the a-Si regions amorphous.

15. The method of claim 10, further comprising the step of:
  regrowing a portion of the second c-SiGe layer removed during the partially recessing step using MBE or CVD.

16. The method of claim 10, wherein the step of forming the bottom spacers and top spacers in the gate trenches comprises:
  forming a thermal oxide in the gate trenches, wherein the thermal oxide is formed in the gate trenches having a thickness t1 on SiGe surfaces and a thickness t2 on Si surfaces, and wherein t1>t2; and
  removing the thermal oxide from the Si surfaces, while the thermal oxide remains on the SiGe surfaces as the bottom spacers and top spacers.

* * * * *